United States Patent [19]

Clarke et al.

[11] Patent Number: 5,781,847
[45] Date of Patent: Jul. 14, 1998

[54] MICROWAVE TRANSMITTER AND COMMUNICATIONS SYSTEM

[75] Inventors: Ian M. Clarke, Disley, England; Stuart M. Feeney, Campbell, Calif.

[73] Assignee: U.S. Philips Corporation, New York, N.Y.

[21] Appl. No.: 526,025

[22] Filed: Sep. 8, 1995

[30] Foreign Application Priority Data

Sep. 10, 1994 [GB] United Kingdom ............... 9418294

[51] Int. Cl.$^6$ ............................................. H04B 1/00
[52] U.S. Cl. ..................... 455/69; 455/103; 455/155; 455/119; 370/486
[58] Field of Search ........................ 455/119, 67.5, 455/69, 70, 255, 257, 67.1, 115, 196.1, 125, 265, 67.3, 71, 126, 127, 3.2, 103, 24; 348/723; 370/480, 485, 486, 488

[56] References Cited

U.S. PATENT DOCUMENTS

| | | | |
|---|---|---|---|
| 4,545,075 | 10/1985 | Miller et al. | 455/3.2 |
| 4,747,160 | 5/1988 | Bossard . | |
| 5,125,100 | 6/1992 | Katznelson | 455/6.1 |
| 5,294,895 | 3/1994 | Feeney et al. | 331/9 |
| 5,471,647 | 11/1995 | Gerlach et al. | 455/63 |

OTHER PUBLICATIONS

"MPT 1550, Issue 1, Performance Specification for Analogue Multipoint Video Distribution Systems . . . " Sep., 1993, pp. i–30.
"British Telecom Technology Journal", vol. 7, No. 1, Jan. 1989, pp. 1–19.
"The M$^3$VDS Saxmundham Demonstrator: Multi–Channel TV Distribution by mm–Waves" By M. Pilgrim et al on pp. 5–19 of The British Telecom Technology Journal, vol. 7, No. 1, Jan. 1989.

*Primary Examiner*—Andrew Faile
*Assistant Examiner*—Aung S. Moe
*Attorney, Agent, or Firm*—Leroy Eason

[57] ABSTRACT

In multiple-channel microwave transmitters and communications systems, such as multi-point video distribution systems operating at frequencies of around 29 GHz or 40 GHz, good frequency stability for each of the channel frequencies is achieved with a feed-back loop including an error detector circuit. The error detector circuit (39,29) is coupled between a sampler and an input circuit of the source. This detector circuit detects any drift or other error in the carrier frequency of the sample from the desired microwave frequency for that channel signal and provides a corrective signal to the input circuit. The part of the feed-back loop comprising at least a part of the detector circuit is common to a group of the channels. Switch means couple the common part of the feed-back loop between the sampler and the source input circuit of each channel, and so permit this common part to be time multiplexed between the respective feed-back loops of the group of channels. The input circuit for each source applies an up-datable bias signal for regulating the frequency of the source in accordance with the last corrective signal generated by the detector circuit for that source. By adopting such a stabilisation arrangement in accordance with the present invention, expensive component parts of the feed-back loop can be common to a group of the channels, so reducing the assembly cost of the multiple-channel transmitter. Good long-term frequency stability for all the channels can be obtained, including a reliably constant frequency relationship between the channels.

10 Claims, 3 Drawing Sheets

MICROWAVE TRANSMITTER AND COMMUNICATIONS SYSTEM

BACKGROUND OF THE INVENTION

1. Field of the Invention

This invention relates to multiple-channel microwave transmitters and communications systems, particularly but not exclusively millimeter-wave multi-channel multi-point video distribution systems operating at frequencies of around 29 GHz or 40 GHz.

2. Discussion of the Related Art

The article "The M3VDS Saxmundham Demonstrator: Multi-channel TV Distribution by Millimeter-Waves" by M Pilgrim et al on pp 5–19 of the British Telecom Technology Journal, Vol 7, No 1, January 1989, describes such a multiple-channel television distribution system for delivering television and video signals to domestic subscribers. The whole contents of this British Telecom Technology Journal article are hereby incorporated herein as reference material. The article describes a single cell installation with a transmitter sited at a convenient location on a perimeter of the cell. However, as mentioned in the article, an omni-directional antenna may be used at the centre of the cell. Furthermore, such a system may be used with frequency and polarisation diversity to cover a much wider area with multiple cells, each having its own transmitter.

The multiple-channel microwave transmitter described in the British Telecom Technology Journal article comprises a plurality of microwave sources, each source providing a channel signal at a desired microwave frequency for a respective channel; a respective input circuit is present at an input of each source for regulating the microwave frequency of the source; and coupling means feed the channel signals from the sources to a transmission antenna. In the form described in this article, the microwave source for each channel is a frequency-modulated millimeter-wave Gunn oscillator, and each channel has its own transmission antenna.

In Section 2.6 of the British Telecom Technology Journal article, a typical set of system parameters are given, among which are the following: up to 25 or so programme channels, each with a band width of 30 MHz. A centre-to-centre channel spacing of 38 MHz was proposed at that time (1989). In this context, the frequency stability of the transmitter is considered in Section 2.4 of the British Telecom Technology Journal article. It is stated there that, in order to limit adjacent channel interference, the oscillator drift should be limited to ±4 MHz. It was believed that most of the oscillator frequency drift would be due to ambient temperature variations, and that (at least for the UK climate) the desired frequency stability could be achieved readily by temperature stabilisation of each Gunn diode oscillator. This is the only stabilisation means proposed in Section 2.4 and Section 3.3.3, for stabilising the transmission frequency of each channel signal.

More recently very much stricter requirements have been placed on the good long-term frequency stability of the transmitter as a key system parameter. In order to make efficient use of the spectrum, minimum standards of performance have been drawn up and promulgated by the relevant authorities regulating broadcasting in different countries, for example in the CEPT (Conference of European Post and Telecommunication Administration) countries. Specifically for the United Kingdom (GB), the relevant standard is MPT 1550: "Performance Specification for Analogue Multipoint Video Distribution Systems (MVDS), Transmitters and Transmit Antennas Operating in the Frequency Band 40.5 GHz–42.5 GHz". The whole contents of Issue 1 (September 1993) of this MPT 1550 Performance Specification (published by the Radiocommunications Agency, an executive agency of the UK Government Department of Trade & Industry, London) are hereby incorporated herein as reference material. In accordance with a specification such as MPT 1550, the frequency error of each transmitted carrier (under both normal and extreme conditions) must not exceed: ±12.5 ppm (i.e ±0.5 MHz at 40 GHz).

In accordance with the MPT 1550 MVDS channel plan (part of which is given below), the nominal frequency relationship (channel spacing) between carriers must at all times be constant 29.5 MHz±1.0 MHz.

The necessary transmitter stability can be achieved by frequency locking the microwave source to a stable reference source, for example a dielectric resonator oscillator, using a feed-back loop as described in, for example, U.S. Pat. No. 5,294,895 (Our Ref PHB 33744). The contents of said U.S. patent are hereby incorporated as reference material. However, the provision of such a feedback loop for each of the microwave sources of such a multiple-channel transmitter can be too expensive, particularly as the number of channels increases to, for example, 60 or more.

SUMMARY OF THE INVENTION

According to a first aspect of the present invention there is provided a multiple-channel microwave transmitter comprising a plurality of microwave sources providing channel signals at desired microwave frequencies for respective channels, respective input circuits at inputs of the sources for regulating the microwave frequencies of the sources, the transmitter being provided with stabilization means for stabilising the frequencies of the channel signals. Such a transmitter in accordance with the invention is characterised in that the stabilization means comprises sampling means for taking samples of the channel signals of the sources and further comprises feed-back loops including error detector means between the sampling means and the input circuits of the respective sources, which detector means serves for detecting any errors in the microwave frequencies of the samples from the desired microwave frequencies for the respective channel signals and for providing corrective signals to the input circuits, and, in that a portion of the feed-back loops which portion comprises at least a part of the detector means, is common to a group of the channels. Switch means couple the common part of the feed-back loop between the sampling means and the input circuits of the sources for the group, and permit such common part to be time multiplexed between the respective feed-back loops of the group. The input circuits for the respective sources apply to the input of the sources up-dateable control signals for regulating the frequencies of the sources in accordance with the last corrective signals generated for the respective sources by the detector means.

By adopting such a stabilisation arrangement in accordance with the present invention, expensive component parts of the feed-back loop can be common to a group of the channels, so reducing the assembly cost of the multiple-channel transmitter. By using such a feed-back loop having common parts, good long-term frequency stability for all the channels in the group can be obtained, including the desired constant frequency relationship between the channels. The good frequency stability and reduced assembly cost permit the group and/or total transmitter to have a large number of channels, each with their microwave source stabilised in this manner.

Thus, for example, if the transmitter has 60 channels, a single common frequency discriminator or other frequency error detector circuit may be provided for all 60 channels. A stable common frequency reference source may also be used for all 60 channels. If the bandwidth of the frequency lock loop is of the order of 1 Hz, then a pull-in time of approximately 30 seconds is required for frequency locking each microwave source. With each channel frequency-locked in the feed-back loop for 30 seconds, the common part of the feed-back loop can be time multiplexed between 60 channels in 30 minutes. For the 29½ minutes that each respective microwave source is not locked in the feed-back loop, the input circuit holds the input of the source to a control signal corresponding to the last updated corrective signal generated for that source by the detector circuit.

The detector circuit may comprise a mixer as well as a frequency discriminator. Other components such as amplifiers, filters and pre-scalers may optionally be included. The mixer may be coupled to the sampler and serve for mixing a stable reference with the sample and thereby generating a frequency signal which comprises any error in the microwave frequency of the channel signal from its desired microwave frequency. The frequency discriminator may be coupled between the mixer and the input circuit and serve for providing the corrective signal for regulating the microwave frequency of the source in accordance with the frequency signal generated by the mixer. The stable reference and at least the frequency discriminator of the feed-back loop may be common to the group of channels.

The common part of the feed-back loop may include the mixer as well as the frequency discriminator. However, each source in the group may have a respective mixer in its detector circuit; in that case the common part of the feed-back loop would not include these respective mixers.

Each microwave source may generate its channel signal at the frequency at which it is to be transmitted by the transmission antenna. However, each microwave source may generate its channel signal at a sub-harmonic of that frequency. In this latter case, outside the feedback loop for frequency stabilisation of the source, a frequency multiplier (sometimes also termed "scaler") may be included in the coupling means from the microwave source to the transmission antenna. This arrangement permits the use of lower cost microwave sources of lower frequency (e.g 13 GHz to 14 GHz sources with a tripler for 40 GHz to 42 GHz transmission).

The sampler for each microwave source may be within the transmitter or external to the transmitter. Thus, in one particular form, the common part of the feed-back loop may comprise a mixer and a frequency discriminator which are part of a common monitoring receiver which is located at a site external to the transmitter but within a transmission area of the transmitter. This monitoring receiver may have a receiving antenna forming the sampler of the feed-back loop for sampling the channel signals from the transmission antenna. The common part of the feed-back loop may also include a data link from the site of this external monitoring receiver to the transmitter.

According to another aspect of the present invention there is provided a multiple-channel microwave communications system having a microwave transmitter in accordance with the first aspect of the present invention, and subscribing receivers within a transmission area of the transmitter for receiving the channel signals from the transmitter.

The present invention may be used to stabilise multiple-channel transmitters in a variety of communications systems, for example a microwave point-to-multipoint video distribution service and/or in a digital data communications system, and/or in an RF radio or telephony system. The invention is particularly advantageous for providing long-term frequency stability of the different neighbouring transmitters in a multiple cell cellular system. Thus, an important embodiment of this invention involves its incorporation in a millimeter-wave multichannel multipoint video distribution system, currently of considerable interest for multiple channel broadcasting to small and medium size conurbations.

BRIEF DESCRIPTION OF THE DRAWINGS

These and other features in accordance with the present invention are illustrated specifically in embodiments of the present invention now to be described, by way of example, with reference to the accompanying diagrammatic drawings. In these drawings.

It should be noted that all the drawings are diagrammatic, relative dimensions and proportions having been exaggerated or reduced in size, for the sake of clarity and convenience in the drawings. The same reference signs are generally used to refer to corresponding or similar features in the different embodiments.

DETAILED DESCRIPTION OF THE PREFERRED EMBODIMENTS

Figure 1:
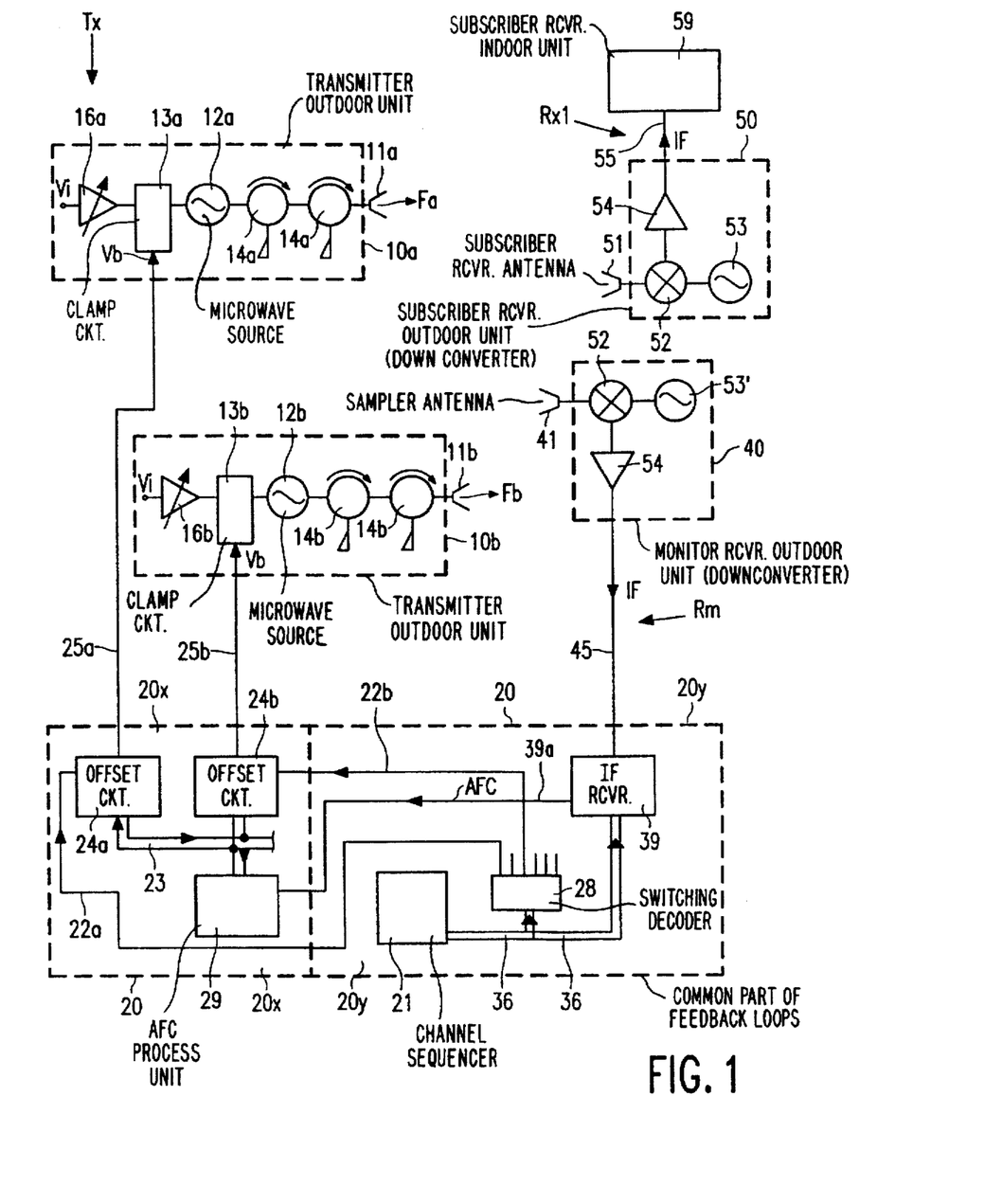
FIG. 1 is a block schematic circuit diagram of a multiple-channel microwave transmitter having an external monitor as part of a frequency stabilisation loop in accordance with the present invention.

FIG. 1 shows a multiple-channel microwave transmitter Tx as part of a millimeter-wave multi-channel point-to-multipoint video distribution system. Within the transmission area of the transmitter Tx various domestic and/or commercial subscribers are present each having a receiver Rx for receiving channel signals from the transmitter. FIG. 1 shows one such subscriber Rx1. The transmitter Tx comprises a plurality of microwave sources 12. Each such source provides a channel signal at a desired microwave frequency F for a respective channel. In practice a large number of channels (for example about 50 or 60) may be present. For convenience in the drawing, FIG. 1 shows only two channels designated as a and b. Thus the channel signal at carrier frequency Fa is provided by source 12a, whereas the channel signal at carrier frequency Fb is provided by source 12b. A respective input circuit (13a,24a), (13b,24b), ... is coupled to an input of each source 12a, 12b ... for regulating the microwave frequency of the source. Coupling means 14 are present between the output of the source 12 and a transmission antenna 11, for feeding the channel signals from the sources 12 to the transmission antenna 11.

The transmitter Tx is provided with stabilisation means in accordance with the present invention, for stabilising the frequency F of each channel signal. For each source 12a, 12b . . . , this stabilisation means comprises a sampler antenna 41 for taking a sample of the channel signal Fa,Fb . . . of that source 12a, 12b . . . , and further comprises a feed-back loop 20,40 including an error detector circuit formed by elements 39,29. The error detector circuit is coupled between the sampler antenna 41 and the input circuit 13,24 at the input of the source 12. This detector circuit 39,29 serves for detecting any drift or other error in the carrier frequency F of the sample from the desired microwave frequency for that channel signal and for providing a corrective signal to the input circuit 13,24.

Also in accordance with the present invention, the part of the feed-back loop 20,40 comprising the detector circuit formed by elements 39,29 is common to a group of the channels. Switch means formed by elements 28,38 (see FIGS. 1 and 2) are present in the feed-back loop 20,40 for coupling the common part of the feed-back loop between the sampler antenna 41 and the source input circuit 13,24 of each channel and for permitting this common part to be time multiplexed between the respective feed-back loops of the group of channels. The input circuit (13a,24a),(13b,24b), . . . for each source 12a,12b . . . applies a control signal regulating the frequency Fa,Fb . . . of the source 12a, 12b . . . in accordance with the last corrective signal AFC generated by the detector circuit 39,29 for that source. Thus, the feed-back loop 20,40 is used to monitor the channel frequency Fa,Fb . . . of each oscillator source 12a, 12b . . . and to regulate the operation of the source 12a, 12b . . . so controlling its frequency Fa,Fb . . . .

Figure 2:
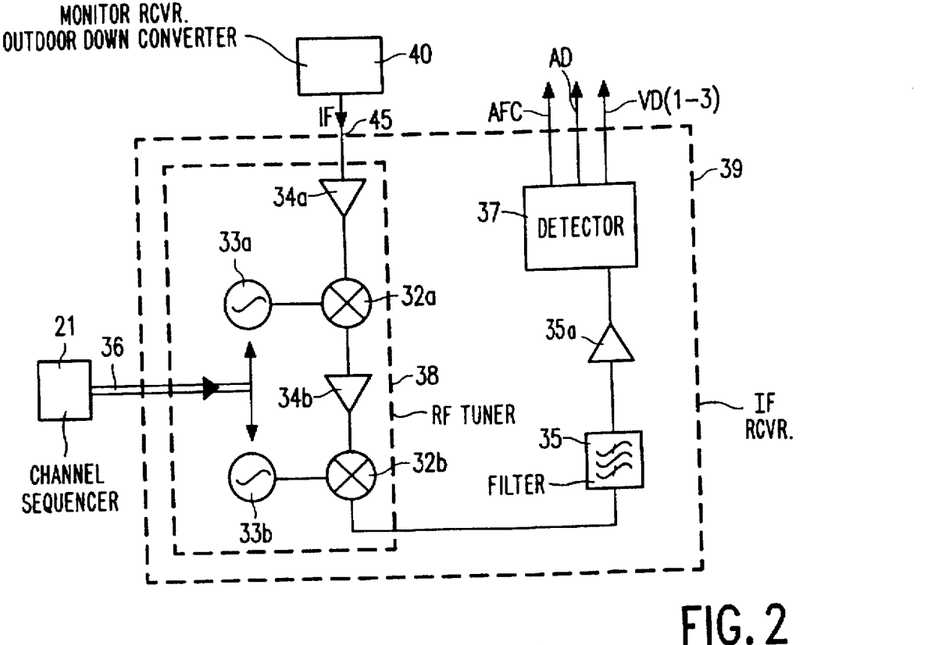
FIG. 2 is a block schematic circuit diagram of one example of a monitoring receiver for the stabilised transmitter of FIG. 1.

Except for the frequency stabilisation features in accordance with the present invention, this multiple-channel microwave transmitter Tx and the video distribution system of FIG. 2 may be of known type. The set up may be similar to the millimeter-wave multi-channel multi-point video distribution system described in the British Telecom Technology Journal article, but with a high, modern performance specification to meet the requirements of, for example, the MPT 1550 standard. Thus, for example, as illustrated in FIG. 1, each channel may have its own transmission antenna 11. The microwave sources 12 may be frequency-modulated millimeter-wave Gunn oscillators. Each source 12 may include a tuning varactor for regulating the microwave frequency of the source; and so in this case, the control signal from the input circuit 13 is a bias signal for the tuning varactor of the Gunn oscillator. The transmitter Tx may be located at a convenient site on the perimeter of its transmission area. However, an omni-directional transmitter may be used at the centre of a cell, as mentioned in the British Telecom Technology Journal article and in the MPT 1550 Performance Specification. U.S. Pat. No. 4,747,160 describes examples of such a cellular television system with omni-directional transmitters. The contents of thereof are hereby incorporated herein as reference material. The system in accordance with the present invention may include various additional systems features, as described in such patent and/or in the British Telecom Technology Journal article. Such a system may be used with both frequency and polarisation diversity to cover a much wider area with multiple cells, each having its own transmitter Tx.

Recently, two frequency bands in the microwave region have been allocated for broadcast purposes. These bands are from 40.5 GHz to 42.5 GHz in CEPT (Conference of European Post and Telecommunication Administrations) countries and from 27.5 GHz to 29.5 GHz in other countries. There are several plans to use these frequency bands for distributing television programmes direct to the homes of subscribers. The systems specified in the MPT 1550 Standard operate in the 40.5 GHz to 42.5 GHz frequency band. Those described in the British Telecom Technology Journal article and in U.S. Pat. No. 4,747,160 operate in the 27.5 to 29.5 GHz waveband. The transmitter Tx and the system of FIG. 1 may be designed to operate in one of these wavebands, 27.5 GHz to 29.5 GHz or 40.5 GHz to 42.5 GHz, or at any other frequency authorised by the relevant authorities. TV signal information transmitted by the sources 12 may be in any accepted format. Thus, the TV signal can have an analogue format (e.g PAL, NTCS or SECAM) or a digital format (e.g MPEG) may be used for future systems.

In the embodiment illustrated in FIG. 1, the sampler end of the feed-back loop comprises a monitoring receiver Rm associated with sampler 41 and at some distance from the transmitter Tx. The transmission area of the transmitter Tx may extend over a distance which is between, for example, 2 to 7 km from the transmitter Tx. The external monitoring receiver Rm may be located between, for example, 10 m and 500 m from the transmitter antenna 11. The monitoring receiver Rm has a receiving antenna which forms part of the common sampler antenna 41 of this feed-back loop for sampling all the channel signals Fa, Fb . . . from the transmission antenna 11. The feed-back loop also includes a data link 45 which couples the outdoor unit 40 of the monitoring receiver Rm to the transmitter Tx.

In the block schematic of FIG. 1, the broken outlines 10,20,40,50 indicate separate units which may be accommodated in a convenient manner outdoors and indoors. Thus, reference 10 indicates an outdoor unit associated with each transmission antenna 11. Reference 40 indicates an outdoor unit associated with the common antenna 41 of the monitoring receiver Rm. Reference 50 indicates an outdoor unit in the form of a down-converter of known type, associated with a receiving antenna 51 of a subscribing receiver Rx. Reference 59 indicates an indoor domestic receiver unit of known type for outputting (in known format, e.g via a television receiver) the channel signals requested by the subscriber. The components and circuitry within the block 20 may be conveniently located in one or more indoor units 20x,20y at the site of the transmitter Tx and/or monitoring receiver Rm. Specific examples for the construction of each one of these units 10,20,40,41 in the embodiment of FIG. 1 will now be described.

In the illustrated example of an outdoor unit 10 of the transmitter Tx, each microwave source 12a,12b . . . is coupled to its respective transmission antenna 11a, 11b . . . by isolators 14a, 14b . . . Each source 12,12b . . . preferably comprises, in known manner, a Gunn diode with a varactor diode which provides the oscillator tuning and frequency modulation. The source 12 (via its varactor diode) is biased by a respective clamp circuit 13a, 13b . . . which applies a DC bias voltage Vb to the input of the oscillator 12a, 12b . . . . Each clamp circuit 13a, 13b . . . receives two inputs, namely a data signal input Vi via an amplifier 16 and the bias voltage signal Vb from a programmed offset circuit 24. The data signal at input Vi is a varying voltage representative of the information to be transmitted by that channel. The bias signal Vb comprises two important components, namely (i) a programming offset voltage level corresponding to the bias level required to set the oscillation frequency of the source 12a, 12b . . . to the desired centre frequency of the channel a,b . . . , and (ii) the corrective signal AFC from the loop 20,40.

The clamp circuit 13 may be of known form and serves in known manner to perform the following functions. The circuit 13 acts as a video clamp to eliminate excessive transient levels in the data signal Vi. It also sums the varying data signal Vi with the bias voltage Vb from the line 25. It forms a buffer between a programming offset circuit 24 and the source 12, so presenting a standard interface to the lines 25a,25b, . . . even though their respective sources 12a, 12b, . . . are operating on different sections of the tuning characteristic of the source 12 in order to oscillate at their respectively different centre frequencies Fa,Fb, . . . for the different channels a,b, . . . The sensitivity of the outdoor unit 10 may also be set via its circuit 13. The circuit 13a, 13b . . . of the respective outdoor unit 10a, 10b . . . receives its input Vb from a programming offset circuit 24a,24b . . . of the indoor unit 20x, preferably at the site of the transmitter Tx.

The programming offset circuit 24a,24b . . . sets the respective channel offset signal for biasing the respective oscillator 12a, 12b . . . to generate the desired microwave carrier frequency for its channel. A channel plan in accordance with the MPT 1550 Standard may be adopted for the carrier frequencies Fa,Fb,Fc . . . etc. In this case, the channels are organised alternately in two groups, one transmitted with horizontal polarisation and the other transmitted with vertical polarisation. Within the groups, the channel spacing is kept constant (by the frequency stabilisation loop in accordance with the present invention) at: 29.5 MHz±1.0 MHz.

Thus such a scheme permits 64 channels to be accommodated as follows:

| HORIZONTAL POLARISATION GROUP | | VERTICAL POLARISATION GROUP | |
|---|---|---|---|
| CHANNEL NUMBER | NOMINAL CENTER FREQUENCY (GHz) | CHANNEL NUMBER | NOMINAL CENTER FREQUENCY (GHz) |
| 1 | 40.53500 | 2 | 40.54975 |
| 3 | 40.56450 | 4 | 40.57925 |
| 5 | 40.59400 | 6 | 40.60875 |
| 7 | 40.62350 | 8 | 40.63825 |
| ETC | ETC | ETC | ETC |
| 63 | 41.44950 | 64 | 41.46425 |

The frequency-lock loop 20,40 in accordance with the present invention ensures that any frequency error in each carrier Fa,Fb, . . . etc does not exceed: ±0.5 MHz (i.e ±12.5 ppm at 40 GHz).

Furthermore, the achievement of the required constancy in channel spacing (29.5 MHz±1.0 MHz) within a group is facilitated by at least a part of the detector circuit 39,29 being common for that group and by this common part being time multiplexed (by switch means 28,38) between the channels of the group.

As known, the tuning characteristic of the oscillator 12 (corresponding to the tuning characteristic of a varactor diode for a varactor-tuned Gunn oscillator) is non-linear over the bias range used for generating the range of frequencies Fa,Fb, . . . in the channel plan. Therefore, a non-equal bias-voltage spacing is used to generate the desired series of channel frequencies Fa,Fb, . . . in accordance with the non-linear tuning characteristic. These pre-set non-equally spaced bias voltages (channel voltages) are generated in the programming offset circuit 24a,24b, . . . for their respective sources 12a, 12b, . . . . . Furthermore, this circuit part 24 sums this channel-programming bias voltage with the filtered and amplified error corrective signal AFC from the AFC process unit 29 of the error detector circuit 39,29. The respective programming offset circuit part 24a, 24b, . . . of each source input circuit (13a,24a), (13b,24b), . . . includes an up-datable signal hold function (for example, using a holding capacitor) for maintaining the bias signal Vb incorporating the last corrective signal AFC generated by the circuit unit 29 for that respective source 12a, 12b, . . . . . This signal is held in the circuit part 24a,24b, . . . (and hence maintained on the respective line 25a,25b, . . . for that source) until the next time the circuit part 24a,24b, . . . receives a new (the next) corrective signal AFC from the common detector circuit part 29, upon being multiplexed again into the feed-back loop. The time sequencing for multiplexing the common part of the feed-back loop is controlled by a microcontroller sequencer unit 21 which controls the switch means formed by elements 28,38 via a control bus 36. The updating of the corrective bias signal held in the circuit part 24a,24b, . . . for a respective source 12a, 12b, . . . is controlled by an enable signal on the respective line 22a,22b, . . . from the switching decoder unit 28.

In a specific example of the FIG. 1 embodiment designed to meet the MPT 1550 specification, the channels of the horizontal-polarisation group may have one common monitor Rm 41,40,39 with its own common error detector circuit 29,39, and the channels of the vertical-polarisation group may have another common monitor Rm with its own common detector circuit 29,39. Alternatively, all the channels of both groups (i.e all the channels transmitted by the transmitter Tx) may have a single common error-detector 29,39.

The sampling antenna 41 of the monitoring receiver Rm may be of the same type as is used for the receiving antenna 51 of the domestic receiver Rx. Similarly, the outdoor downconverter unit 40 of the monitoring receiver Rm may be of the same type as the outdoor downconverter unit 50 of the domestic receiver Rx.

The outdoor units 40 and 50 of these receivers Rm and Rx use heterodyning to convert the channel signals at microwave frequency Fa,Fb . . . to an intermediate frequency (IF) signal. The units 40,50 thus comprise a mixer 52 having a first input to which the respective antenna 51,41 is coupled by a transmission line. A local oscillator (LO) source 53 is coupled to a second input of the mixer 52. The output of the mixer 52 is connected to an IF power amplifier 54. These down-converters 40 and 50 may convert a received RF signal in the frequency band 40.5 GHz to 42.5 GHz or 27.5 GHz to 29.5 GHz into an IF signal in the range of, for example, about 1 GHz to 2 GHz.

In the subscribing receiver Rx, the IF output of the unit 50 may be transmitted by, for example, coaxial cable to the indoor unit 59. The indoor unit 59 may convert the IF signal into a signal suitable for a customary television receiver. The indoor unit 59 may be of a type commercially available from Philips Consumer Electronics and used for the reception of direct broadcast satellite (DBS) transmissions. By converting the transmitted microwave signal to an IF signal in the standard UHF band of 1 to 2 GHz, a standard DBS IF receiver/demodulator can be used for the unit 59. The IF receiver 59 includes (in known manner) automatic frequency control (AFC) which enables it to track the combined drift of the receiver LO source 53 and the transmitter source 12 for the channel a,b, . . . being detected.

Although the monitoring receiver Rm may be of a similar type to the subscribing receiver Rx, a more stable local oscillator 53' is used for the monitoring receiver Rm. For example, the local oscillator 53' of the monitor Rm may comprise a crystal resonator (with optionally a stabilisation loop) to give a stability of at least ±0.2 MHz.

When the indoor unit 20y is located at the site of the monitoring receiver Rm, the link 45 between the units 40 and 20y may be by coaxial cable. An IF receiver 39 in the unit 20y may be similar to the IF receiver 59 of the domestic subscriber Rx, except for the channel switching. Thus, instead of switching the channels manually as in the IF receiver of the subscriber set 59, the channels to which the IF receiver 39 is tuned are changed by a microcontroller sequencer 21. The IF receiver 39 includes AFC in a similar way to that of the domestic receiver 59. FIG. 2 shows an example of a suitable arrangement for the IF receiver 39 of the monitoring receiver Rm.

Apart from the control bus 36 from the external microcontroller sequencer 21, the IF receiver 39 of FIG. 2 is of known format. It comprises a UHF RF tuner stage 38, a VHF IF amplifier stage 35,35a and a detector stage 37. The UHF IF signal from the monitor's outdoor unit 40 is input at the UHF RF tuner stage 38. An automatic frequency control signal AFC, an audio signal AD, and a video signal VD (1–3; chrominance, luminance and sync) are derived in known manner as outputs from the detector stage 37.

Thus, the RF tuner stage 38 may comprise low-noise amplifiers 34a,34b, mixers 32a,32b and local oscillators 33a,33b. The frequencies of the local oscillators 33a,33b are tuned to shift the VHF output of the RF tuner stage 38 in known manner in accordance with the channel spacing, so that the output of mixer 32b (for the centre frequency of the channel a,b, . . . which is to be monitored) lies in the pass-band of the VHF IF amplifier 35a. The pass-band of the amplifier 35a may be determined precisely in known manner by a ceramic filter 35 at the input of the amplifier 35a. The band width of this filter 35 may be, for example, 6 MHz or less. Thus channel selection is made in the conventional manner by the RF tuner stage 38 of the IF receiver 39. However, the RF tuner stage 32a,32b,34a,34b is automatically sequentially switched through the series of channels a,b . . . by the microcontroller sequencer 21. This is achieved by stepping the frequency of the LO sources 33a and 33b in the RF tuner stage 38 by means of control signals on bus 36 from the microcontroller sequencer 21 instead of using such control signals from a manually operated control unit as in a conventional receiver 59.

By heterodyning the UHF IF signal from the down-converter 40 with the tuned stable reference frequencies of the LO sources 33a and 33b, the RF tuner stage generates an IF signal in the VHF frequency band for each channel a,b, . . . when selected. This VHF IF signal comprises as a component any frequency drift in the transmitted channel frequency Fa,Fb, . . . for that channel. This VHF IF signal is then converted in the detector stage 37 into the output signals AFC, AD and VD(1-3). Thus, the stage 37 comprises known video and audio detectors and amplifiers for generating the audio signal AD and video signal VD (chrominance, luminance and sync) in known manner from the output of the VHF IF amplifier 36. The stage 37 also comprises a known automatic frequency control circuit for generating as a voltage the AFC signal in known manner from the output of the VHF IF amplifier 36. This AFC signal includes as a component a measure of any frequency drift in the transmitted channel frequency Fa,Fb . . . . for the selected channel a,b . . . . The AFC voltage signal is output from the receiver 39 on line 39a which is connected to an input of the AFC process unit 29. The AFC signal on the line 392 is a standard quality output voltage from the frequency discriminator of the indoor receiver 39. The process unit 29 serves to process this standard AFC voltage by filtering and amplification so that the AFC signal is suitable for summation with the channel voltages in the programming offset circuits 24a,24b, . . . . Thus, the feed-back loop 20,40 of FIG. 1 for stabilising the channel frequency Fa,Fb, . . . of each respective source 12a, 12b, . . . comprises a common sampler antenna 41, a common down-converter unit 40, a common UHF IF receiver 39, a common AFC process unit 29, a respective channel programming offset circuit 24a,24b, . . . for each channel and a respective clamp circuit 13a,13b, for each channel . . . . A UHF RF tuner 38 and a decoder 28 (both controlled by the microcontroller sequencer 21) form the time-multiplex switching means for the common parts of the feed-back loop 20,40.

The bandwidth of the frequency lock feedback loop 20,40 of FIG. 1 may be, for example, about 1 Hz, so as to be below the 10 Hz bottom video frequency. In this case, the "pull in" time of the frequency lock feedback loop for any one channel a,b . . . is approximately 30 seconds. Thus, the common part 29,39,40 of the loop 20,40 can sweep through 60 channels in 30 minutes, with each channel being held sequentially in the loop for its respective 30 seconds. For 29½ minutes of the 30 minute cycle, each channel oscillator 12 is not locked in the loop 20,40. However, during these 29½ unlocked minutes, the channel oscillator 12a, 12b . . . is held to the last updated loop instruction by its respective bias circuit (13a,24a),(13b,24b). . . .

In the feed-back loop 20,40 of FIG. 1, there is a UHF IF data link 45 from the down-converter 40 to the IF receiver 39, an AFC line 39a from the IF receiver 39 to the AFC process circuit 29, and an AFC line 23 from the AFC process circuit 29 to the programming offset circuits 24a,24b. . . . Control signals from the microcontroller sequencer 21 are transmitted on a control bus 36 to the IF receiver 39 and to the switching decoder 28. Enable signals from the switching decoder 28 are transmitted on respective control lines 22 to the programming offset circuits 24. When the unit 20x is located at the transmitter site and the unit 20y is located at the site of the monitoring receiver Rm, the AFC line 39a forms the data link from the site of the monitoring receiver Rm to the transmitter Tx, and the control bus 22 must also be included in this link between Tx and Rm. When both the units 20x and 20y are located at the site of the transmitter Tx, the IF line 45 forms the data link from the site of the monitoring receiver Rm to the transmitter Tx. In this latter case, the line 45 may be a screened cable or double-screened cable. It may be, for example, coaxial cable. However, preferably the maximum length of such a coaxial cable line 45 is less than about 200 to 300 meters.

In the embodiment of FIGS. 1 and 2, the common part of the feed-back loop formed by elements 20,40 includes a mixer 52 in the outdoor downconverter unit 40 and a frequency discriminator in the detector stage 37 of the indoor IF receiver unit 39. The common mixer 52 mixes a stable reference frequency from common source 53' with the sample and thereby generates a UHF signal IF which comprises any error in the microwave frequency F of the channel signal from its desired microwave frequency. The frequency discriminator in the detector stage 37 provides the corrective signal AFC which is used for regulating the microwave frequency of the source 12 in accordance with this UHF signal IF generated by the mixer 52.

Figure 3:
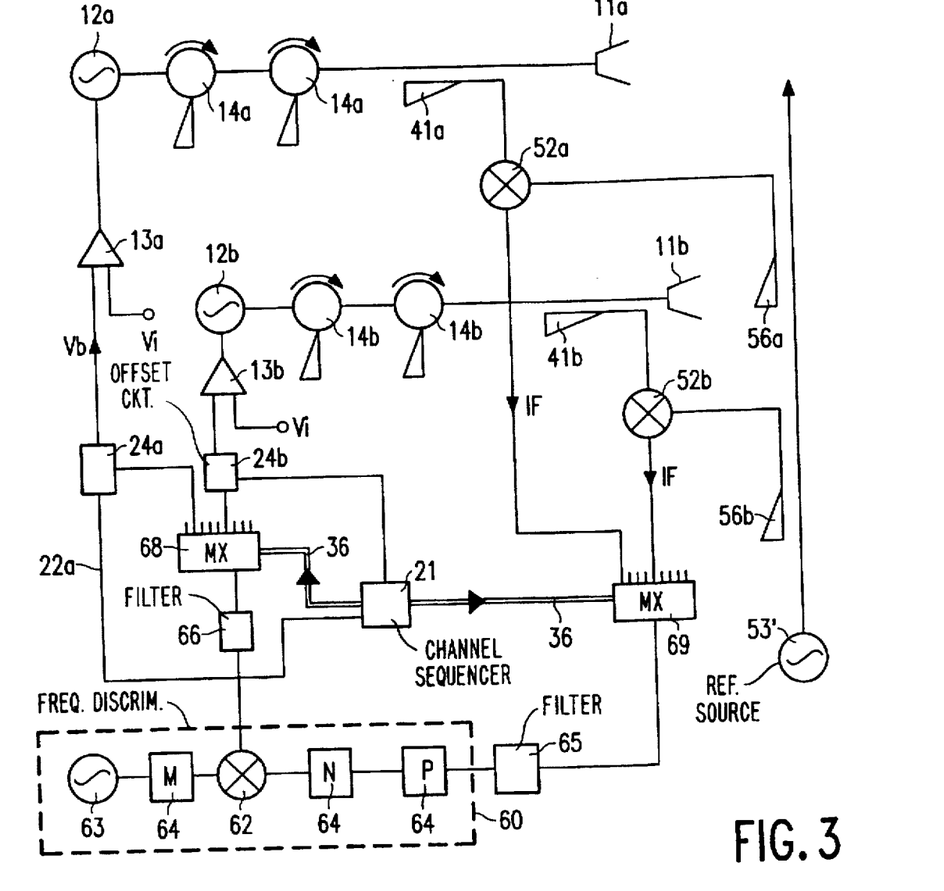
FIG. 3 is a block schematic circuit diagram of a second embodiment of a frequency-stabilised multiple-channel microwave transmitter in accordance with the present invention and having an internal sampler.
Figure 4:
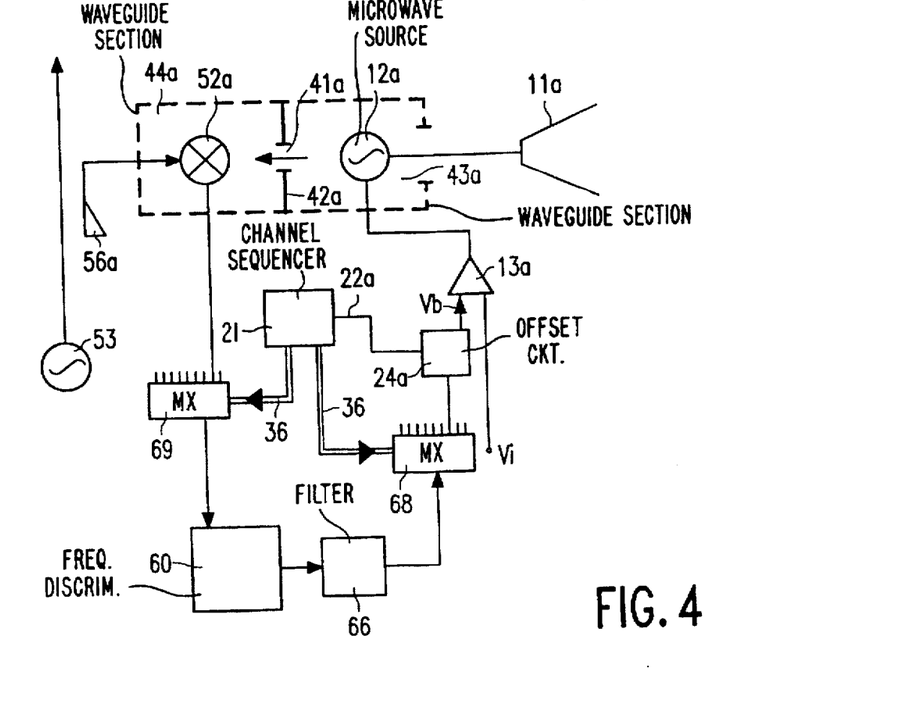
FIG. 4 is a block schematic circuit diagram of a third embodiment of a frequency-stabilised multiple-channel microwave transmitter in accordance with the present invention and having an internal sampler for each microwave source as a modification of the stabilised source arrangement in U.S. Pat. No. 5,294,895.

FIGS. 3 and 4 illustrate embodiments of a different type in which each microwave source 12a, 12b . . . has its own respective mixer 52a,52b . . . in the error detector circuit.

Furthermore, each source 12a,12b ... has its own respective sampler 41a,41b .... The multiplexed frequency stabilisation means for each microwave source 12a, 12b ... now forms part of the transmitter circuit, instead of comprising an external monitor.

In the embodiment of FIG. 3, a sample of the channel signal of each source 12a, 12b ... is taken by a directional coupler 41a,41b ... in the transmission line to its respective transmission antenna 11a, 11b .... This sample is fed to the first input of the individual mixer 52a,52b ... associated with that source 12a, 12b ... A stable reference frequency from a source 53' is fed to the second input of the mixer 52a,52b ... All the mixers 52a,52b ... share a common stable reference source 53' via respective directional couplers 56a,56b .... It is a lower cost solution to provide individual mixers 52a,52b ... rather than to provide switching at millimeter wave frequencies for a common mixer 52 for all the sources 12a, 12b .... The intermediate frequency signal IF from each mixer 52a,52b ... comprises any error in the microwave frequency of the channel signal from its desired microwave frequency.

The IF signal is fed to a frequency discriminator 60 in a frequency lock loop for controlling the biasing of the microwave sources 12a, 12b ..... The frequency discriminator 60 forms a common part of the loop which is time multiplexed between the respective channels by means of multiplexers 68,69. The switching of the multiplexers 68,69 is controlled by the microcontroller sequencer 21. Thus the IF signal from each mixer 52a,52b ... is fed sequentially to the frequency discriminator 60 via the multiplexer 69 and a filter 65. The frequency discriminator 60 generates a corrective voltage signal which is output to the respective bias circuit (13a,24a),(13b,24b), ... via a filter 66 and the multiplexer 68.

In the form illustrated by way of example in FIG. 3, the frequency discriminator 60 comprises a mixer 62 and a stable frequency reference source 63. Depending on the frequency level of the source 63, harmonic multipliers and/or dividers 64 may be included in the IF input to the mixer 62 or the reference input to the mixer 62.

In the example illustrated in FIG. 3, each bias circuit (13a,24a),(13b,24b), ... comprises a channel programming offset circuit 24 and an operational amplifier 13. The operational amplifier 13 combines the circuit functions of units 15 and 16 of FIG. 1 and has two inputs. One input is for the corrective bias signal Vb from the frequency discriminator 60 via the programming offset circuit 24a,24b, ..., for regulating the microwave frequency of the source 12a, 12b .... The other input is for a data signal representative of information to be transmitted on the channel of that source, for example video data Vi. The programming offset circuit 24a,24b, ... is enabled by a signal on a respective line 22a,22b, ... from the microcontroller sequencer 21 and includes a up-datable signal storage means (typically a capacitor) for maintaining its output Vb. By this means the operational amplifier 13a,13b ... applies to the input of its respective source 12a, 12b ... the bias signal Vb for regulating the frequency of the source in accordance with the last corrective signal generated by the frequency discriminator 60 for that source 12a, 12b ....

FIG. 4 shows a modification of the embodiment of FIG. 3, incorporating several of the advantageous features of the frequency stabilisation arrangement disclosed in U.S. Pat. No. 5,295,895. Thus, instead of a directional coupler 41, the sampler for each channel source 12a,12b ... is formed by a coupling aperture 41a,41b ... in a reflective wall 42a,42b ... of a waveguide section 43a,43b ... of that microwave source 12a, 12b .... As described in the aforesaid patent, the respective mixer 52a,52b ... may be mounted in its own waveguide section 44a,44b ... on the other side of the reflective wall 42a,42b ... the two waveguide sections 43 and 44 of the respective sources 12a, 12b ... may be bolted together; and the mixers 52a,52b ... may be harmonic mixers which each comprise a substrate with an inductive probe. The frequency discriminator 60 may be constructed in known manner as, for example, a Foster Seeley discriminator or a ratio detector or a phase-lock loop or a pre-set programmable comparator which compares the frequency error signal with a reference from a stable source to generate the output voltage. The frequency discriminator 60 may include an amplifier. The loop filter 66 may include an amplifier so as to provide gain. The individual units 13a, 13b, ... may be low-cost line driver circuits, summing the signals Vi and Vb. Thus, low-cost components may be used to provide all the individual non-common units of the frequency stabilisation loop of each source 12a, 12b, ....

Many modifications and variations are possible. As described above, a Gunn diode is preferably used as the oscillator device in each of the microwave sources 12a, 12b ... and its frequency may be tuned with a varactor diode. Gunn oscillators are particularly advantageous because they have very good phase stability. However, other types of oscillator device may be used instead, for example other negative-resistance diodes or a field-effect transistor; thus, the transistor may be connected in known manner in a feed-back tuning network to function as an oscillator device. Whichever device is chosen to form the oscillator 12, it should have adequate phase stability during the time that its input circuit 13,24 is not locked into the common feed-back loop 20,40,60. Thus, the feed-back loop in accordance with the present invention provides frequency stability but does not provide phase noise improvement. The control signal held by the input circuit 13,24 (in accordance with the last corrective signal granted for that source 12 in the feed-back loop) cannot provide real-time phase control of the source 12.

FIG. 4 illustrates a waveguide construction for the microwave source 12a, 12b .... However, microstrip and other microwave transmission technologies may be used instead of waveguide.

Figure 5:
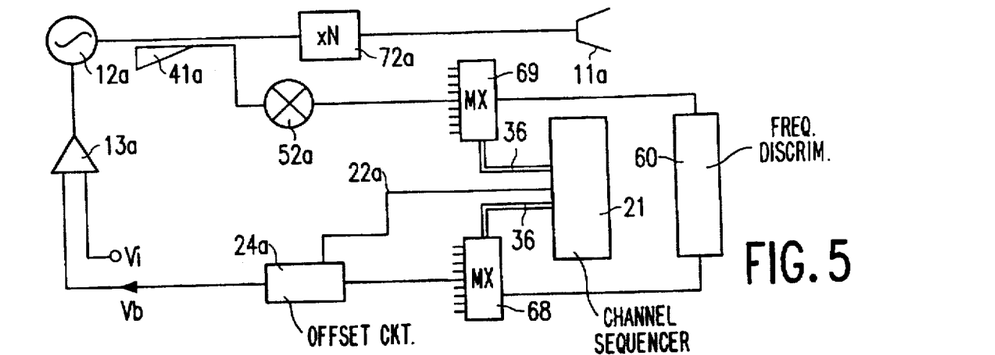
FIG. 5 is a block schematic circuit diagram illustrating a variant microwave source and sampler arrangement which is also suitable for use in an embodiment of the invention.

Instead of the oscillator 12a generating its channel signal in the desired frequency band of 40.5 GHz to 42.5 GHz or 27.5 GHz to 29.5 GHz, a source 12 oscillating at a lower frequency may be used, and its frequency may then be increased with a multiplier 72. Such an arrangement is illustrated in FIG. 5. In this case, the sampler 41 may sample the channel signal a,b ... before its frequency is increased by the multiplier 72. Such an arrangement having a common frequency discriminator 60 and common multiplexers 68,69 for all the channels a,b ... is illustrated in FIG. 5. Each microwave source 12a, 12b, ... generates its channel signal at a sub-harmonic of the frequency Fa,Fb, ... at which it is to be transmitted by the transmission antenna 11a, 11b, .... The respective frequency multiplier 72 (for example, a tripler) is included in the coupling from the microwave source 12a, 12b, ... to the antenna 11a, 11b, ... and this frequency multiplier 72 is outside the feed-back loop 41,52, 60,24,13 for frequency stabilisation of the source 12a, 12b .... Such an arrangement can result in a lower manufacturing cost for the transmitter. The sampler 41 may be a directional coupler formed using microstrip technology. For the sake of convenience in the drawing, FIG. 5 shows only one of the channel sources 12a, 12b, ...., and the stable reference source 53' which is coupled to the individual mixers 52a,52b, . . . is also not shown in FIG. 5.

In the embodiments of FIGS. 1 to 5 the sampled frequency or frequency shift has been converted into a voltage by the frequency discriminator 37.60. However, suitable feed-back loops can be built with a different type of frequency convertor whose output is a current instead of a voltage.

From reading the present disclosure, other variations and modifications will be apparent to persons skilled in the art. Such variations and modifications may involve equivalent and other features which are already known in the design, manufacture and use of microwave transmitters and cellular communications systems and component parts thereof and which may be used instead of or in addition to features already described herein. Although Claims have been formulated in this Application to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any Claim and whether or not it mitigates any or all of the same technical problems as does the present invention. The Applicants hereby give notice that new Claims may be formulated to such features and/or combinations of such features during the prosecution of the present Application or of any further Application derived therefrom.

We claim:

1. A multi-channel microwave transmitter comprising:

a plurality of microwave sources for providing channel signals at desired microwave frequencies for respective channels;

respective input circuits at inputs of the sources for regulating the microwave frequencies of the sources; and frequency stabilization means for stabilizing the frequencies of the channel signals, said frequency stabilization means comprising:

sampling means for taking samples of the channel signals of the sources;

frequency down-conversion means for down-converting the frequencies of the samples of the channel signals by mixing with a stable frequency reference;

feedback loops coupled between the frequency down-conversion means and the input circuits of the respective sources, the feedback loops for a group of the channels having a shared common portion which includes error detector means for detecting any deviations of the microwave frequencies of the samples from the desired microwave frequencies of the respective channels in said group, and providing corrective control signals to the input circuits; and switching means for providing time-division multiplexed interconnection of the common portion of the feedback loops between the frequency down-conversion means and the input circuits of the sources of all of the channels in said group;

the input circuits of the respective sources supplying up-datable control signals thereto for regulating the frequencies of the sources in accordance with the latest corrective control signals generated by said error detector means for the respective sources.

2. The transmitter as claimed in claim 1, further wherein the frequency down-conversion means comprises a mixer and the detector means comprises a frequency discriminator; the mixer is coupled to the sampling means and is adapted to mix the stable frequency reference with the samples to thereby obtain intermediate frequency signals which comprise any deviation of the microwave frequencies of the channel signals from the desired microwave frequencies; the frequency discriminator is coupled between the mixer and the input circuits and provides the corrective control signals for regulating the microwave frequencies of the sources in accordance with the frequency signals generated by the mixer; and the stable frequency reference and at least the frequency discriminator portion of the detector means are common to the group of channels.

3. The transmitter as claimed in claim 2, further wherein the common portion of the feed-back loops includes the mixer as well as the frequency discriminator.

4. The transmitter as claimed in claim 3, further wherein the mixer and the frequency discriminator are part of a monitoring receiver which is located at a site external to the transmitter, the monitoring receiver having a receiving antenna forming the sampling means of the feed-back loop for sampling the channel signals from the transmission antenna, and the common portion of the feed-back loops includes a data link from the site of the monitoring receiver to the transmitter.

5. The transmitter as claimed in claim 2, further wherein the sources in the group of channels have respective mixers in the detector means, the common portion of the feed-back loops does not include these respective mixers, the stable frequency reference is produced by an oscillator which is coupled to all the respective mixers for the group, and the mixers are coupled via the switch means to the frequency discriminator.

6. The transmitter as claimed in claim 1, wherein the input circuits for the sources comprise respective operational amplifiers having first inputs for data signals representative of information to be transmitted on the channels of the respective sources, and second inputs for the corrective control signals for regulating the microwave frequencies of the sources.

7. The transmitter as claimed in claim 1, wherein the microwave sources generate their channel signals at a subharmonic of the frequency at which it is to be transmitted by the transmission antenna, and frequency multipliers are included in the coupling means from the microwave sources to the transmission antenna, which frequency multipliers are not included in the feed-back loops for frequency stabilisation of the sources.

8. The transmitter as claimed in claim 1, wherein the microwave sources are Gunn oscillators.

9. The transmitter as claimed in claim 1, wherein the transmitter comprises a plurality of antennas corresponding to the plurality of sources, each source having its output coupled to the respective antenna for that channel.

10. A multiple-channel microwave communications system comprising a microwave transmitter as claimed in claim 1, and subscribing receivers within a transmission area of the transmitter for receiving the channel signals from the transmitter.

* * * * *